US010860767B1

(12) United States Patent
Farhan et al.

(10) Patent No.: US 10,860,767 B1
(45) Date of Patent: Dec. 8, 2020

(54) SYSTEMS AND METHODS FOR TRANSIENT SIMULATION OF CIRCUITS WITH MUTUAL INDUCTORS

(71) Applicant: Cadence Design Systems, Inc., San Jose, CA (US)

(72) Inventors: Mina Adel Aziz Farhan, San Jose, CA (US); Joel R. Phillips, Walnut Creek, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 444 days.

(21) Appl. No.: 15/860,382

(22) Filed: Jan. 2, 2018

(51) Int. Cl.
*G06F 30/367* (2020.01)
*G06F 17/11* (2006.01)
*G06F 17/16* (2006.01)
*G06F 17/13* (2006.01)

(52) U.S. Cl.
CPC ............ *G06F 30/367* (2020.01); *G06F 17/11* (2013.01); *G06F 17/16* (2013.01); *G06F 17/13* (2013.01)

(58) Field of Classification Search
CPC ........ G06F 30/367; G06F 17/11; G06F 17/16; G06F 17/13
See application file for complete search history.

(56) References Cited

U.S. PATENT DOCUMENTS

2007/0299647 A1* 12/2007 Bolcato ................. G06F 30/367
703/14

* cited by examiner

*Primary Examiner* — Saif A Alhija
(74) *Attorney, Agent, or Firm* — Schwegman Lundberg & Woessner, P.A.

(57) ABSTRACT

Various embodiments describe performing a transient simulation of circuits that have mutual inductors. In particular, some embodiments perform a transient simulation on a circuit model by removing and approximating the effects of one or more entries of a matrix in the circuit model, where the matrix relates to inductors or mutual inductors of the circuit. In doing so, such embodiments can render the matrix more sparse than before which, in turn, can reduce the time spent during the transient simulation to solve equations of the circuit model.

20 Claims, 6 Drawing Sheets

SYSTEMS AND METHODS FOR TRANSIENT SIMULATION OF CIRCUITS WITH MUTUAL INDUCTORS

TECHNICAL FIELD

Embodiments described herein relate to simulation of circuits and, more particularly, to systems, methods, devices, and instructions for transient simulation of circuits that have mutual inductors.

BACKGROUND

Electronic design automation (EDA) is a category of software systems for assisting with the design of electronic systems and devices, and simulating electrical circuits at a transistor-level is an EDA function to verify whether a digital circuit meets expected constraints. Generally, a transistor-level circuit simulator, such as SPICE (Simulation Program with Integrated Circuit Emphasis), formulates a set of equations that represent the circuit design and, over a small interval of time, the transistor-level circuit simulator solves those equations repeatedly to find segments of the piecewise polynomials.

In addition to transistor-level circuit simulation, the EDA may use Electro-Magnetic (EM) simulation tools to model parasitic effects (e.g., signal delay, distortion, and attenuation) in circuit designs (e.g., post-layout circuits, power grids, printed circuit boards (PCBs), and high-speed interconnects) using linear components, such as resistors, capacitors, inductors, and mutual inductors (e.g., an RLC circuit). Such EM simulation tools typically generate large linear models, which are then embedded in a larger system with other devices and the larger system is then simulated.

Unfortunately, use of mutual inductors to simulate parasitic effects can become a bottleneck for a computing device that is simulating a circuit design. In some instances, the number of mutual inductors in a single model can reach the order of millions. Such a large number of mutual inductors can result in large and dense matrices that a simulation uses to solve linear equations modeling a circuit design. As the number of mutual inductors that exist in the circuit design increases, the sparsity of the matrices associated with the mutual inductors decreases, and the more time is needed to solve the matrices. This can cause a slow-down in the overall simulation time. Additionally, removing the mutual inductors entirely from a system could result in significant loss of accuracy in the simulation results.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
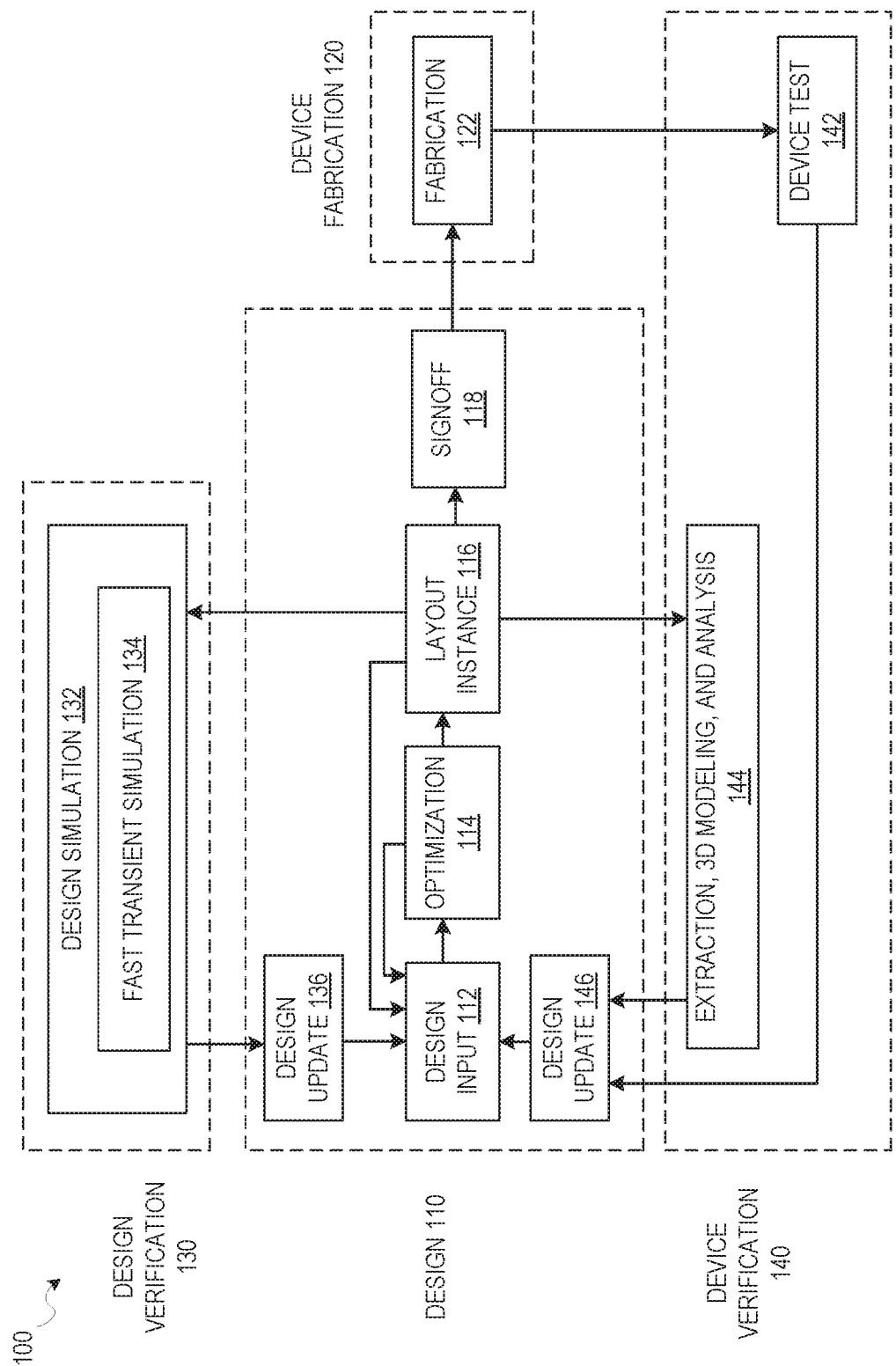
FIG. 1 is a diagram illustrating an example design process flow including a transient simulation of a circuit design having mutual inductors, according to some embodiments.

As noted herein, use of mutual inductors to simulate parasitic effects of a circuit design can adversely affect how quickly a computing device can simulate the circuit design. Traditionally, modeling parasitic effects involves a large number of mutual inductors, which result in large and dense matrices that a circuit simulation processes during operation.

Embodiments described herein relate to electronic design automation (EDA) and to systems, methods, devices, instructions, and computer media for transient simulation of a circuit design, such as a post-layout circuit, having mutual inductors. In particular, some embodiments provide for transient simulation of a circuit design that comprises a large number of mutual inductors (e.g., to model parasitic effects). Some embodiments may improve a transient simulation of a circuit design such that the improved transient simulation is faster than conventional transient simulations (e.g., by two to three times) without sacrificing accuracy of one or more waveforms outputted by the improved transient simulation. Additionally, various embodiments may generalize systems, methods, devices, and instructions described herein for use by circuit simulations other than just transient simulations, such as small signal and RF circuit simulations.

According to some embodiments, a model of a circuit design comprises at least one matrix-based equation that includes a matrix corresponding to one or more mutual inductors, and one or more entries of that matrix are removed by approximating the effects of those mutual inductors. Some embodiments approximate the effects of mutual inductors approximated using a semi-implicit integration method described herein. The matrix that results from the entry removal(s) may be sparser than the original matrix for the mutual inductors and, as such, during operation of a transient simulation, the resulting matrix may be easier and faster to solve by a computing device than the original matrix. As a result, use of this sparse matrix in the matrix-based equation can reduce the time a computing device would otherwise needs to solve the matrix-based equation.

As an example, a model of a circuit design to be used in a transient simulation may comprise a set of ordinary differential equations (ODE), such as Modified-Nodal Analysis (MNA) equations. As used herein, MNA equations may be defined by Equation 1:

$$\left( \underbrace{\begin{bmatrix} \hat{G} & E \\ E^T & 0 \end{bmatrix}}_{G} x(t) + \underbrace{\begin{bmatrix} \hat{C} & 0 \\ 0 & L \end{bmatrix}}_{C} \dot{x}(t) \right) + f(x(t)) = b(t),$$

where x(t) represents unknown voltages and currents waveforms, $\hat{G}$, $\hat{C}$, and L are matrices comprising stamps for resistors, capacitors and inductors, respectively, E is a selector matrix that maps algebraic equations to the states, f(x(t)) is a vector comprising the stamps for nonlinear currents and charges, and b(t) comprises source values. During operation of a transient simulation, MNA equations may be solved according to a time-stepping technique, where MNA equations are solved at each time step $t_n$ using a numerical integration method, such as a Backward-Euler method defined by:

$$\phi(x_n) = \left(G + \frac{C}{h_n}\right)x_n - \frac{C}{h_n}x_{n-1} + f(x_n) - b(t_n) = 0,$$

where $x_n \approx x(t_n)$ and $h_n = t_n - t_{n-1}$. The discretized equations resulting from the numerical integration may then be solved using a Newton-Raphson iterative method, which may be defined by the following for a $r^{th}$ Newton-Raphson iteration:

$$Jx_n^{r+1} = -\phi(x_n^r), \Delta x_n^{r+1} = x_n^{r+1} - x_n^r$$

where J is the Jacobian matrix that may be defined by Equation 2:

$$J = G + \frac{C}{h_n} + \frac{d(f(x_n^r))}{dx_n}$$

Each Newton-Raphson iteration may be solved using LU factorization of the Jacobian matrix and forward-backward substitution.

By using a sparse matrix for mutual inductors, various embodiments can reduce the time needed to solve a Jacobian matrix at each time step during a transient simulation, and can reduce the time needed for factorizing the Jacobian matrix. Some embodiments first determine an inverse matrix of an inductor matrix associated with MNA equations. This inverse matrix (hereafter, "reluctance matrix") may be diagonally dominant or close to being diagonally dominant, which contributes to the stability of a transient simulation of an embodiment. Some embodiments then select one or more entries of the inductor matrix to be approximated. For example, the entries may be selected such that the resulting matrix will result in the magnitude of largest eigenvalues of a partitioned matrix being less than one, where the partitioned matrix is generated based on the reluctance matrix.

As noted herein, the inductor matrix L in MNA equations (as defined by Equation 1) comprises stamps for inductors of the circuit design, and the L matrix can become very dense when the circuit design has a large number of mutual inductors. To render the Jacobian matrix sparse, various embodiments remove one or more small elements from a reluctance matrix K, which is an inverse of the inductor matrix L (i.e., K=inv(L)). In this way, such embodiments can avoid removing elements from the inductor matrix L to render the Jacobian matrix sparse, which can result in numerical instabilities during operation of a transient simulation and significantly affect accuracy. Additionally, unlike removing elements from the L matrix, the K matrix does not lose definiteness when elements are removed from the K matrix.

Equation 1 can be redefined in terms of the reluctance matrix K as Equation 3:

$$\left(\begin{bmatrix} \hat{G} & E \\ KE^T & 0 \end{bmatrix}x(t) + \begin{bmatrix} \hat{C} & 0 \\ 0 & I \end{bmatrix}\dot{x}(t)\right) + f(x(t)) = b(t),$$

where I is the identity matrix.

For some embodiments, the reluctance matrix K is partitioned according to Equation 4:

$$K = K_d + K_c,$$

such that $K_d$ comprises all diagonal and large valued elements, and $K_c$ comprises all the small valued off-diagonal elements. Additionally, for some embodiments, this partitioning may be achieved according to Equation 5:

$$\sum_{i=1}^{N} K_d(j,i) > \sum_{i=1}^{N} K_c(j,i)$$

For various embodiments, a decoupling percentage $\epsilon$ is used as a criterion for determining elements removed to the $K_c$ matrix, as defined by Equation 6:

$$\frac{\sum_{i=1}^{N} K_c(j,i)}{\sum_{i=1}^{N} K_d(j,i)} = \epsilon,$$

where $0 < \epsilon < 1$. The decoupling percentage c may be determined (e.g., set) prior to a transient simulation of an embodiment. Additionally, increasing the decoupling percentage $\epsilon$ may result in more elements of the K matrix being removed to the $K_c$ matrix and a decrease in accuracy of transient simulation of an embodiment. For example, a decoupling percentage of $\epsilon = 0.2$ could result in an accuracy of 2% relative error by the transient simulation of an embodiment.

According to some embodiments, applying the partitioned reluctance matrices $K_d$ and $K_c$ (according to Equation 4) to Equation 3 would provide Equation 7:

$$\begin{bmatrix} \hat{G} & E \\ K_d E_T & 0 \end{bmatrix}x(t_n) + \begin{bmatrix} 0 & 0 \\ K_c E_T & 0 \end{bmatrix}x(t_n) + \begin{bmatrix} \hat{C} & 0 \\ 0 & I \end{bmatrix}\dot{x}(t_n) + f(x(t_n)) = b(t_n).$$

Based on the $K_c$ matrix comprising very small entries in comparison to the $K_d$ matrix (as described herein), various embodiments apply following approximation defined by Equation 8:

$$\begin{bmatrix} 0 & 0 \\ K_c E_T & 0 \end{bmatrix}x(t_n) \approx \begin{bmatrix} 0 & 0 \\ K_c E_T & 0 \end{bmatrix}x(t_{n-1}).$$

As noted herein, during operation of a transient simulation, MNA equations may be solved according to a time-stepping technique, where MNA equations are solved at each time step $t_n$ using a numerical integration method, such as a Backward-Euler method. Accordingly, for some embodiments, applying a numerical integration method to Equation 7, in view of the approximation of Equation 8, results in Equation 9:

$$(x_n) = \left(\begin{bmatrix} \hat{G} & E \\ K_d E_T & 0 \end{bmatrix} + \begin{bmatrix} \frac{\hat{C}}{h_n} & 0 \\ 0 & \frac{I}{h_n} \end{bmatrix}\right)x_n +$$

-continued $$\left( \begin{bmatrix} \frac{\hat{C}}{h_n} & 0 \\ 0 & \frac{I}{h_n} \end{bmatrix} + \begin{bmatrix} 0 & 0 \\ K_c E_T & 0 \end{bmatrix} \right) x_{n-1} + f(x_n) = b(t_n).$$

Various embodiments solve Equation 9 using Newton-Raphson iterations and a Jacobian matrix defined by Equation 10:

$$J = \begin{bmatrix} \hat{G} & E \\ K_d E_T & 0 \end{bmatrix} + \begin{bmatrix} \frac{\hat{C}}{h_n} & 0 \\ 0 & \frac{I}{h_n} \end{bmatrix} + \frac{d(f(x_n^r))}{dx_n}.$$

In accordance with some embodiments, the Jacobian matrix of Equation 10 is sparse and, consequently, faster to solve than Jacobian matrices used by conventional transient simulations (e.g., Equation 2). As a result, such embodiments provide a transient simulation, of a circuit design having mutual inductors, that operates faster than conventional transient simulations.

To achieve stability of the numerical integration method of Equation 9, various embodiments partition the spectral radius of the partitioned K matrix as less than 1, as defined by Equation 11:

$$\rho(K_d^{-1} K_c) < 1.$$

The spectral radius of the matrix $K_d^{-1} K_c$ may be determined using a Krylov-subspace-based algorithm that finds spectral radius, such as the Arnoldi method, which would involve one LU decomposition of the $K_d$ matrix and a plurality of forward/backward substitutions. If the original K matrix is diagonally-dominant and $K_d$ is completely diagonal, then the spectral radius may be <1 in view of the criteria defined by Equation 5 above. Because this may not always be true, some embodiments ensure stability of the integration method by determining a decoupling percentage ∈ according to Equation 6 using an iterative process that calculates a spectral radius of the $K_d$ matrix and the $K_c$ reluctance matrix. More regarding this iterative process is discussed herein with respect to a method 400 of FIG. 4.

For some embodiments, the reluctance elements of the $K_d$ matrix may be represented or modeled by existing circuit devices without the need for creation of new circuit devices or elements. For instance, mutual inductors using reluctance elements may be represented by Equation 12:

$$K_{11} V_1(s) + K_{12} V_2(s) = s I_1(s).$$

Dividing Equation 12 by s results in Equation 13:

$$K_{11} \frac{V_1(s)}{s} + \frac{K_{12}}{K_{22}} \left( K_{22} \frac{V_s(s)}{s} \right) = I_1(s).$$

With respect to Equation 13, the $$K_{11} \frac{V_1(s)}{s}$$

component of the equation can be represented by an inductor having an inductance of $L = 1/K_{11}$, and the $$K_{22} \frac{V_s(s)}{s},$$

component of the equation can be represented by an inductor having an inductance of $L = 1/K_{22}$.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 including a transient simulation of a circuit design having mutual inductors, according to some embodiments. It will be apparent that other design process flow operations may use the transient simulation of an embodiment, but the design process flow 100 is described here for the purposes of illustration.

As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, timing analysis and optimization are performed in an optimization 114 operation, along with any other automated design processes. Additionally, design constraints for blocks of a circuit design generated with design inputs in the design input 112 operation may be analyzed using timing analysis. While the design process flow 100 shows optimization 114 occurring prior to a layout instance 116, timing analysis and optimization 114 may be performed at any time to verify operation of a circuit design. For instance, in various embodiments, timing analysis in a circuit design may be performed prior to routing of connections in the circuit design, after routing, during register transfer level (RTL) operations, or as part of a signoff 118.

After design inputs are used in the design input 112 operation to generate a circuit layout, and any of the optimization 114 operations are performed, a layout is generated in the layout instance 116. The layout describes the physical layout dimensions of the device that match the design inputs. Prior to this layout being provided to a fabrication 122 operation, the signoff 118 is performed on the circuit design defined by the layout. During the signoff 118, a final signoff optimization or verification is performed on the circuit design.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

A design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the optimization 114 operation may be performed.

As shown, the design simulation 132 includes a fast transient simulation 134 that performs a transient simulation on a post-layout circuit design, such as the layout instance 116, in accordance with various embodiments. The fast transient simulation 134 may transiently simulate the post-layout circuit using a model of the post-layout circuit design, which include a large number (e.g., millions) of mutual inductors that model parasitic effects of the circuit design (e.g., those resulting from high-frequency operation). By performing a transient simulation of an embodiment, the fast transient simulation 134 can perform transient simulation of a model that includes a large number of mutual inductors faster than conventional transient simulations and can do without sacrificing accuracy of one or more waveforms outputted by the fast transient simulation 134. In particular, the model may include one or more matrix-based equations (e.g., MNA equations) that are solved during operation of a transient simulation, and the fast transient simulation 134 may perform a transient simulation on the model by removing and approximating the effects (e.g., using a semi-implicit integration method described herein) of one or more entries of a matrix in the model relating to inductors or mutual inductors (e.g., that simulate parasitic effects in the post-layout circuit design). By doing so, the fast transient simulation 134 can render the matrix more sparse than before which, in turn, can reduce the time spent by the fast transient simulation 134 solving the one or more matrix-based equations of the model.

FIGS. 2-5 are flowcharts illustrating example methods for transient simulation of a circuit design having mutual inductors, according to some embodiments. It will be understood that example methods described herein may be performed by a device (e.g., an EDA computing device executing EDA instructions) in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Figure 2:
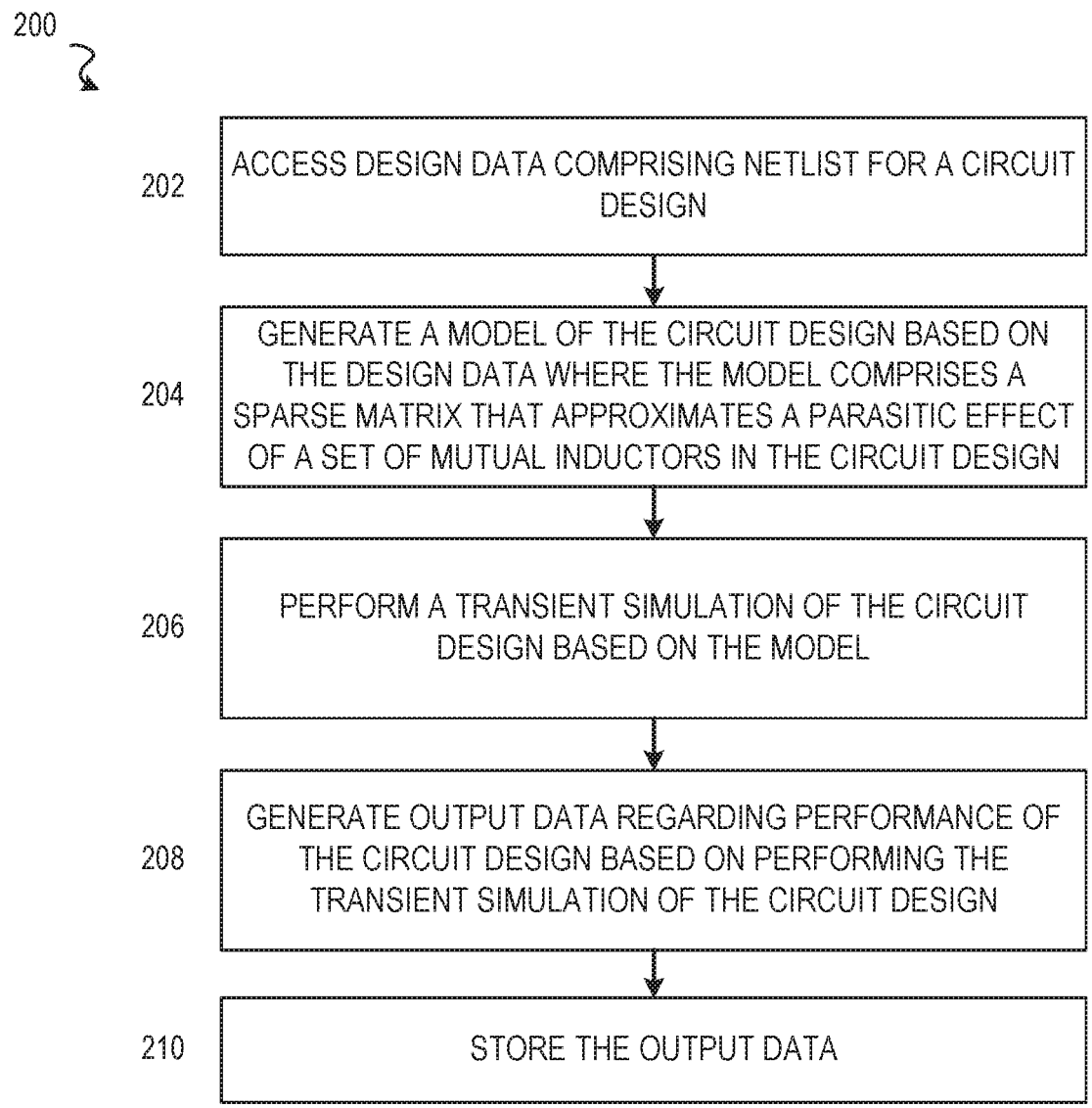
FIGS. 2 and 3 are flowcharts illustrating example methods for transient simulation of a circuit design having mutual inductors, according to some embodiments.

Referring now to FIG. 2, an operation of the method 200 (or another method described herein) may be performed by a hardware processor (e.g., central processing unit or graphics processing unit) of a computing device (e.g., desktop, server, etc.). The method 200 as illustrated begins with operation 202 accessing design data comprising a netlist for a circuit design. As described herein, examples of the circuit design may include, without limitation, post-layout circuits, power grids, printed circuit boards (PCBs), and high-speed interconnects. Depending on the embodiment, the design data may be stored on, and accessed from, a database or some other form of datastore on a storage unit.

The method 200 continues with operation 204 generating a model of the circuit design based on the design data accessed by operation 202, where the model comprises a sparse matrix that approximates a parasitic effect of a set of mutual inductors in the circuit design. According to some embodiments, the model generated by operation 204 comprises a first formulation of Modified Nodal Analysis equations that models the circuit design and includes a reluctance matrix K, where the reluctance matrix K can be determined as an inverse of an inductance matrix that is included in a second formulation of Modified Nodal Analysis equations that that models for the same circuit design. For some embodiments, the first formulation is defined by Equation 3 as described herein, and the second formulation is defined by Equation 1 as described herein. As recited herein, Equation 3 is defined by:

$$\left(\begin{bmatrix} \hat{G} & E \\ KE^T & 0 \end{bmatrix} x(t) + \begin{bmatrix} \hat{C} & 0 \\ 0 & I \end{bmatrix} \dot{x}(t) \right) + f(x(t)) = b(t),$$

and Equation 1 is defined by:

$$\left(\underbrace{\begin{bmatrix} \hat{G} & E \\ E^T & 0 \end{bmatrix}}_{G} x(t) + \underbrace{\begin{bmatrix} \hat{C} & 0 \\ 0 & L \end{bmatrix}}_{C} \dot{x}(t) \right) + f(x(t)) = b(t).$$

For some embodiments, generating the model comprises determining the first formulation of Modified Nodal Analysis equations for the circuit design that includes the reluctance matrix K. As described herein, the reluctance matrix K may be based on the inductance matrix of the second formulation of Modified Nodal Analysis equations. For various embodiments, the first formulation includes the reluctance matrix K and excludes the inductance matrix (e.g., as shown by Equation 3), while the second formulation includes the inductance matrix and excludes the reluctance matrix K (e.g., as shown by Equation 1).

For some embodiments, generating the model further comprises partitioning the reluctance matrix K into a first reluctance matrix $K_d$ and a second reluctance matrix $K_c$ such that the first reluctance matrix $K_d$ is a sparse matrix. The first reluctance matrix $K_d$ may comprise at least all the diagonal values of the reluctance matrix K. Partitioning the reluctance matrix K into a first reluctance matrix $K_d$ and a second reluctance matrix $K_c$ may comprise applying a semi-implicit integration method to the reluctance matrix K to extract the second reluctance matrix $K_c$ from the reluctance matrix K and rendering the first reluctance matrix $K_d$ sparse. Further, partitioning the reluctance matrix K into the first reluctance matrix $K_d$ and the second reluctance matrix $K_c$ may be based on a decoupling percentage $\in$ as defined by:

$$\frac{\sum_{i=1}^{N} K_c(j, i)}{\sum_{i=1}^{N} K_d(j, i)} = \in,$$

for each jth row in $K_d$ and $K_c$.

According to some embodiments, partitioning the reluctance matrix K into the first reluctance matrix $K_d$ and the second reluctance matrix $K_c$ is based on a decoupling percentage determined by an iterative process, which may calculate a spectral radius of the first reluctance matrix $K_d$ and the second reluctance matrix $K_c$.

The determination of the decoupling percentage may be determined prior to a transient simulation being performed on the circuit design. The spectral radius may be calculated by:

$$\rho(K_d^{-1}K_c).$$

Figure 4:
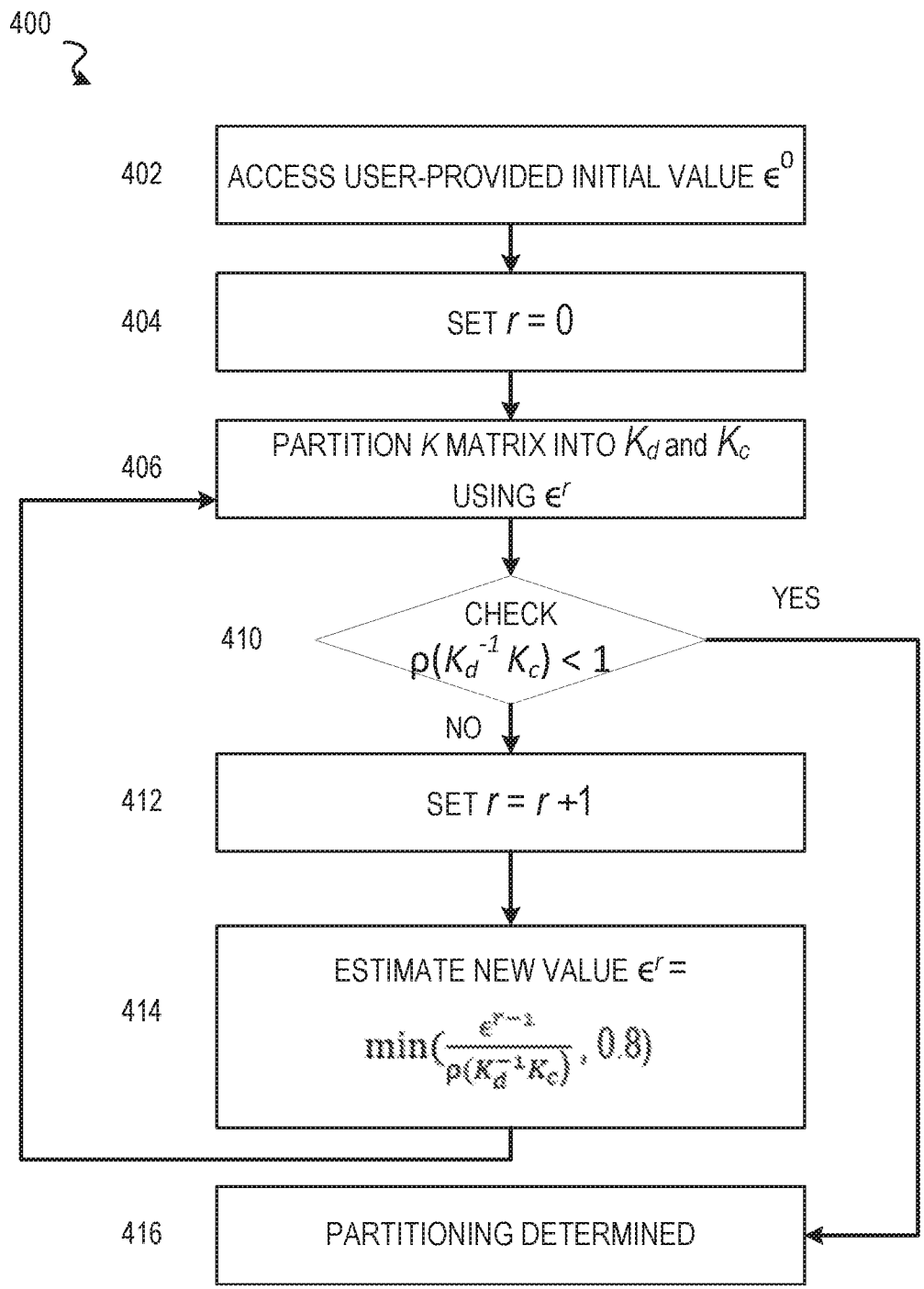
FIG. 4 is a flowchart illustrating an example method for determining a decoupling percentage for a transient simulation, according to some embodiments.

An example of the iterative process is described herein with respect to the method 400 of FIG. 4.

The method 200 continues with operation 206 performing a transient simulation of the circuit design based on the model generated by operation 204.

According to some embodiments, performing the transient simulation of the circuit design based on the model comprises solving a first formulation of MNA equations as determined by operation 204.

The method 200 continues with operation 208 generating output data regarding performance of the circuit design based on the performing of the transient simulation of the circuit design by operation 206. For instance, the output data may comprise waveforms representing output from the circuit design during the transient simulation. The method 200 continues with operation 210 storing the output data to a datastore, which may comprise the same datastore from which the design data was accessed at operation 202. The output data stored by operation 210 may be subsequently used by a human individual (e.g., circuit designer) or an automated process (e.g., of an EDA) to review the results of the circuit design under the transient simulation, which in turn may determine adjustments or modifications applied to the circuit design (e.g., via an EDA) so that the circuit design satisfies one or more applicable design constraints or requirements.

Figure 3:
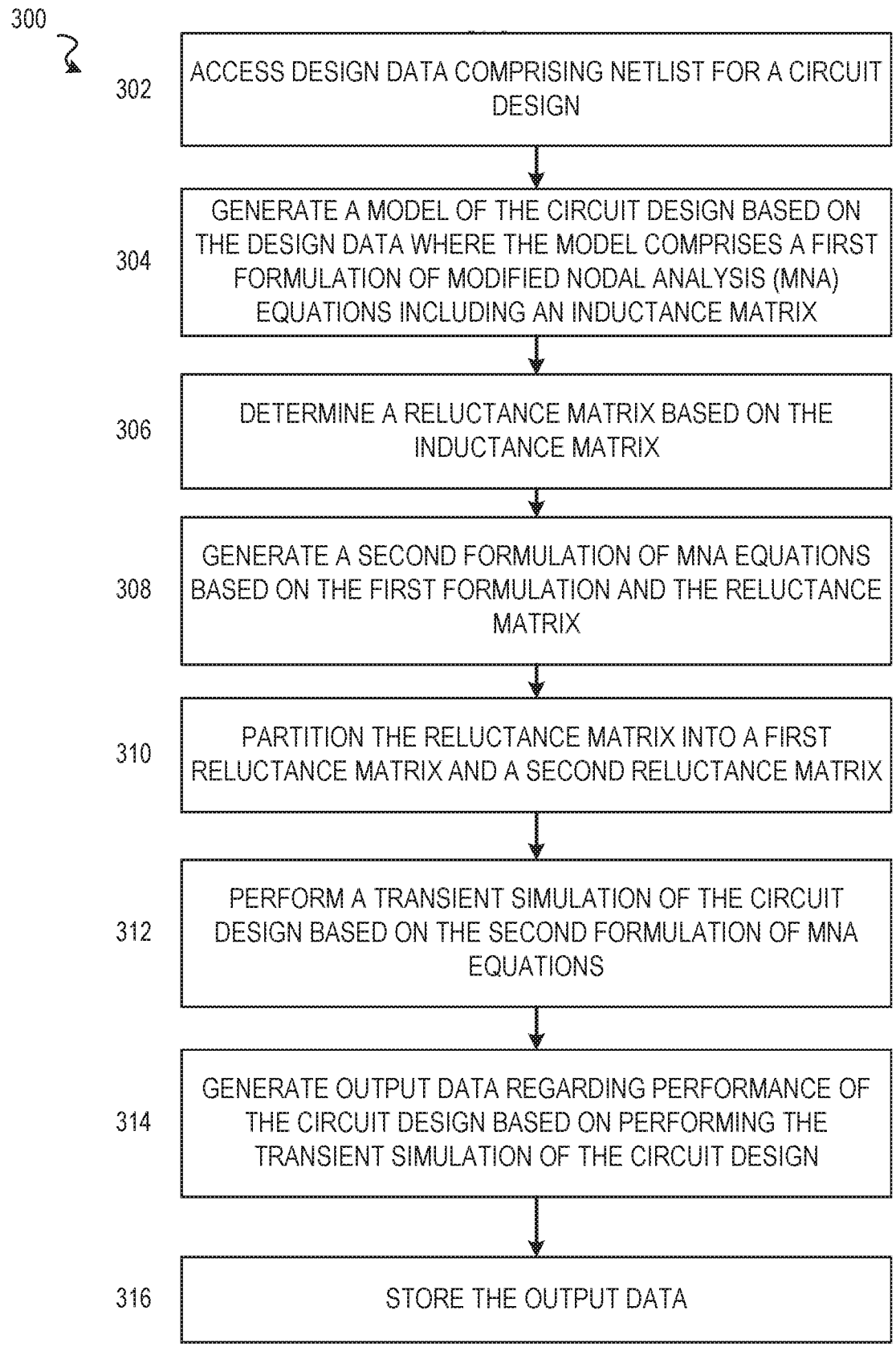

Referring now to FIG. 3, an operation of the method 300 may be performed by a hardware processor of a computing device. As shown, the method 300 begins with operation 302 accessing design data comprising a netlist for a circuit design.

According to some embodiments, operation 302 is similar to operation 202.

The method 300 continues with operation 304 generating a model of the circuit design based on the design data accessed by operation 302, where the model comprises a first formulation of Modified Nodal Analysis equations that includes an inductance matrix. The method 300 continues with operation 306 determining a reluctance matrix based on the inductance matrix, where the reluctance matrix is the inverse of the inductance matrix of the first formulation of Modified Nodal Analysis equations. The method 300 continues with operation 308 generating a second formulation of Modified Nodal Analysis equations based on the first formulation and the reluctance matrix, where the second formulation includes the reluctance matrix.

The method 300 continues with operation 310 partitioning the reluctance matrix K into a first reluctance matrix $K_d$ and a second reluctance matrix $K_c$. As noted herein, partitioning the reluctance matrix K may be performed in accordance with various embodiments described herein, including the method 400 of FIG. 4. The method 300 continues with operation 312 performing a transient simulation of the circuit design, based on the second formulation of Modified Nodal Analysis equations, by solving the set of Modified Nodal Analysis equations using a Jacobian matrix including the first reluctance matrix $K_d$.

The method 300 continues with operation 314 generating output data regarding performance of the circuit design based on the performing of the transient simulation of the circuit design by operation 312. According to some embodiments, operation 314 is similar to operation 208. The method 300 continues with operation 316 storing the output data to a datastore, which may comprise the same datastore from which the design data was accessed at operation 302. According to some embodiments, operation 316 is similar to operation 210.

FIG. 4 is a flowchart illustrating an example method 400 for determining a decoupling percentage for a transient simulation, according to some embodiments. As noted herein, the method 400 may represent an iterative process for determining a decouple percentage used for partitioning a reluctance matrix determined by some embodiments. As shown, the method 400 begins with operation 402 accessing a user-provided initial value $\epsilon^0$ for a decoupling percentage. The user-provided initial value may be based on user input, and may represent an initial guess. The method 400 continues with operation 404 setting the value r to 0. The method 400 continues with operation 406 partitioning a reluctance matrix K into $K_d$ and $K_c$ using a value $\epsilon^0$ for the decoupling percentage. The method 400 continues with operation 410 checking whether a spectral radius of $K_d$ and $K_c$, calculated by $$\rho(K_d^{-1}K_c),$$

is less than one. For some embodiments, the spectral radius may be tested against a value other than one. If operation 410 determines that the spectral radius is less than one, the method 400 continues with operation 416, where the partitioning of the reluctance matrix K into $K_d$ and $K_c$ is complete. If operation 410 determines that the spectral radius is not less than one, the method 400 continues to operation 412, where r is incremented by one.

From operation 412, the method 400 continues to operation 414 estimating a new value $\epsilon^r$ by:

$$\min\left(\frac{\epsilon^{r-1}}{\rho(K_d^{-1}K_c)}, 0.8\right).$$

For some embodiments, the value used in the minimum function is a value other than 0.8. From the operation 414, the method 400 returns to operation 406. In some instances, a desired value for the decoupling percentage may be determined by two to three iterations of the method 400.

Figure 5:
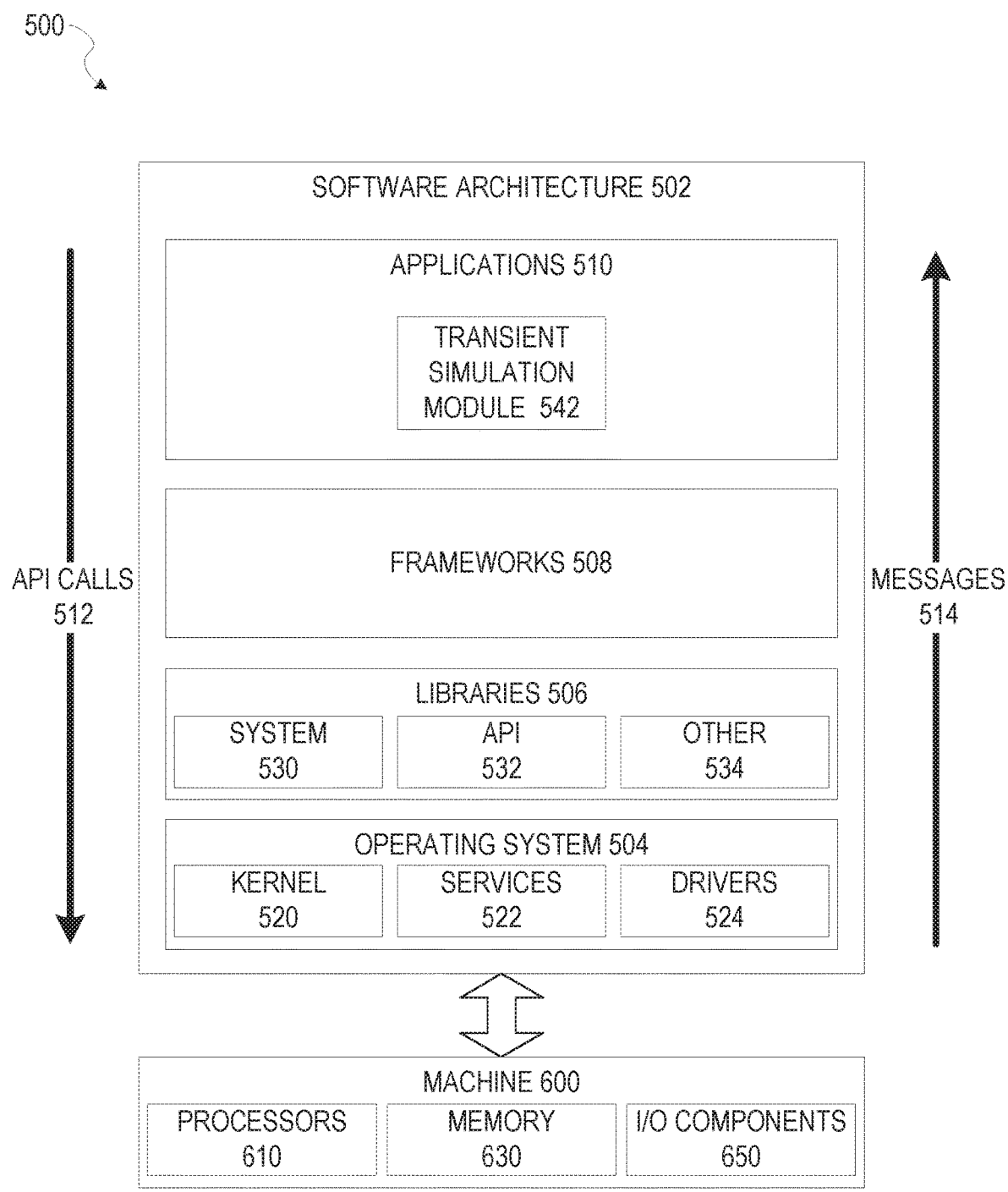
FIG. 5 is a block diagram illustrating an example of a software architecture that may be operating on an electronic design automation (EDA) computing device and may be used with methods for transient simulation of circuits with mutual inductors, according to some embodiments.

FIG. 5 is a block diagram 500 illustrating an example of a software architecture 502 that may be operating on an EDA computer and may be used with methods for transient simulation of circuits with mutual inductors, according to some example embodiments. The software architecture 502 can be used as an EDA computing device to implement any of the methods described above. Aspects of the software architecture 502 may, in various embodiments, be used to access circuit designs, generate models of circuit designs including mutual inductors (e.g., to model parasitic effects), and perform transient simulations of those models in an EDA environment.

FIG. 5 is a non-limiting example of a software architecture 502, and it will be appreciated that many other architectures can be implemented to facilitate the functionality described herein. In various embodiments, the software architecture 502 is implemented by hardware such as a machine 600 of FIG. 6 that includes processors 610, memory 630, and I/O components 650. In this example, the software architecture 502 can be conceptualized as a stack of layers where each layer may provide a particular functionality. For example, the software architecture 502 includes layers such as an operating system 504, libraries 506, software frameworks 508, and applications 510. Operationally, the applications 510 invoke application programming interface (API) calls 512 through the software stack and receive messages 514 in response to the API calls 512, consistent with some embodiments. In various embodiments, any client device, any server computer of a server system, or any other device described herein may operate using elements of the software architecture 502. An EDA computing device described herein may additionally be implemented using aspects of the software architecture 502, with the software architecture 502 adapted for operating to perform a transient simulation of a circuit design in any manner described herein.

In one embodiment, an EDA application of the applications 510 performs a transient simulation of a circuit design according to embodiments described herein using various modules within the software architecture 502. For example, in one embodiment, an EDA computing device similar to the machine 600 includes the memory 630 and the one or more processors 610. The processors 610 also implement a transient simulation module 542 for performing a transient simulation of a circuit design having mutual inductors, in accordance with various embodiments described herein.

In various other embodiments, rather than being implemented as modules of the one or more applications 510, the transient simulation with the transient simulation module 542 may be implemented using elements of the libraries 506, the operating system 504, or the software frameworks 508.

In various implementations, the operating system 504 manages hardware resources and provides common services. The operating system 504 includes, for example, a kernel 520, services 522, and drivers 524. The kernel 520 acts as an abstraction layer between the hardware and the other software layers, consistent with some embodiments. For example, the kernel 520 provides memory management, processor management (e.g., scheduling), component management, networking, and security settings, among other functionality. The services 522 can provide other common services for the other software layers. The drivers 524 are responsible for controlling or interfacing with the underlying hardware, according to some embodiments. For instance, the drivers 524 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 506 provide a low-level common infrastructure utilized by the applications 510. The libraries 506 can include system libraries 530 such as libraries of blocks for use in an EDA environment or other libraries that can provide functions such as memory allocation functions, string manipulation functions, mathematic functions, and the like. In addition, the libraries 506 can include API libraries 532 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 506 may also include other libraries 534.

The software frameworks 508 provide a high-level common infrastructure that can be utilized by the applications 510, according to some embodiments. For example, the software frameworks 508 provide various graphic user interface (GUI) functions, high-level resource management, high-level location services, and so forth. The software frameworks 508 can provide a broad spectrum of other APIs that can be utilized by the applications 510, some of which may be specific to a particular operating system 504 or platform. In various embodiments, the systems, methods, devices, and instructions described herein may use various files, macros, libraries, and other elements of an EDA design environment to implement a transient simulation of a circuit design as described herein. While netlist files, library files, SDC files, and view definition files are examples that may operate within the software architecture 502, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 600 including processors 610), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 600, but deployed across a number of machines 600. In some example embodiments, the processors 610 or processor-implemented modules are located in a single geographic location (e.g., within a home environment, an office environment, or a server farm). In other example embodiments, the processors or processor-implemented modules are distributed across a number of geographic locations.

Figure 6:
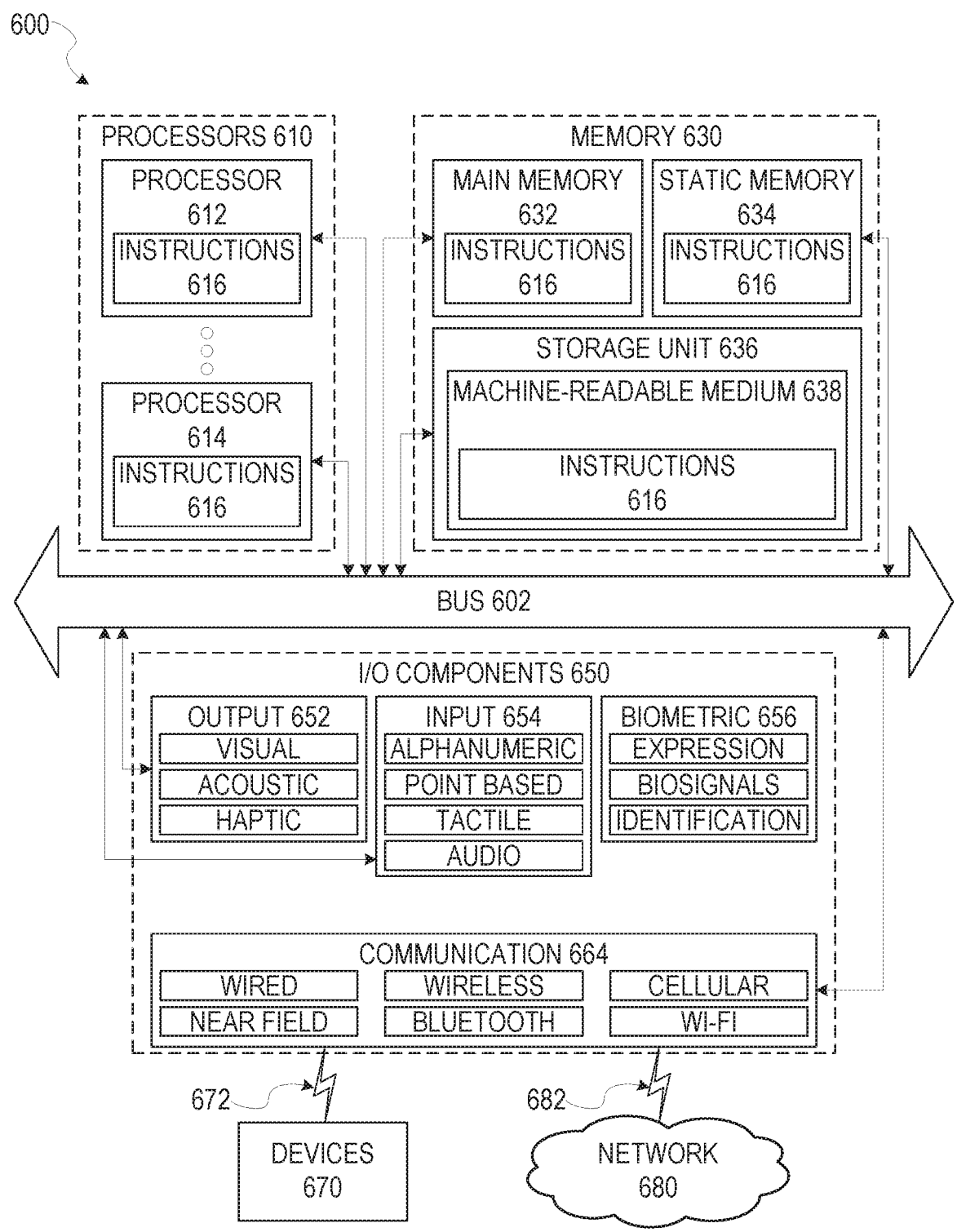
FIG. 6 is a diagram representing a machine in the form of a computer system within which a set of instructions are executed, causing the machine to perform any one or more of the methods discussed herein, according to some example embodiments.

FIG. 6 is a diagrammatic representation of the machine 600 in the form of a computer system within which a set of instructions may be executed for causing the machine 600 to perform any one or more of the methodologies discussed herein, according to an example embodiment. FIG. 6 shows components of the machine 600, which is, according to some embodiments, able to read instructions from a machine-readable medium (e.g., a machine-readable storage medium) and perform any one or more of the methodologies discussed herein. Specifically, FIG. 6 shows a diagrammatic representation of the machine 600 in the example form of a computer system, within which instructions 616 (e.g., software, a program, an application, an applet, an app, or other executable code) for causing the machine 600 to perform any one or more of the methodologies discussed herein can be executed. In alternative embodiments, the machine 600 operates as a standalone device or can be coupled (e.g., networked) to other machines. In a networked deployment, the machine 600 may operate in the capacity of a server machine or a client machine in a server-client network environment, or as a peer machine in a peer-to-peer (or distributed) network environment. The machine 600 can comprise, but not be limited to, a server computer, a client computer, a personal computer (PC), a tablet computer, a laptop computer, a netbook, or any machine capable of executing the instructions 616, sequentially or otherwise, that specify actions to be taken by the machine 600. Further, while only a single machine 600 is illustrated, the term "machine" shall also be taken to include a collection of machines 600 that individually or jointly execute the instructions 616 to perform any one or more of the methodologies discussed herein.

In various embodiments, the machine 600 comprises processors 610, memory 630, and I/O components 650, which can be configured to communicate with each other via a bus 602. In an example embodiment, the processors 610 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 612 and a processor 614 that may execute the instructions 616. The term "processor" is intended to include multi-core processors 610 that may comprise two or more independent processors 612, 614 (also referred to as "cores") that can execute the instructions 616 contemporaneously. Although FIG. 6 shows multiple processors 610, the machine 600 may include a single processor 612 with a single core, a single processor 612 with multiple cores (e.g., a multi-core processor 612), multiple processors 610 with a single core, multiple processors 610 with multiple cores, or any combination thereof.

The memory 630 comprises a main memory 632, a static memory 634, and a storage unit 636 accessible to the processors 610 via the bus 602, according to some embodiments. The storage unit 636 can include a machine-readable medium 638 on which are stored the instructions 616 embodying any one or more of the methodologies or functions described herein. The instructions 616 can also reside, completely or at least partially, within the main memory 632, within the static memory 634, within at least one of the processors 610 (e.g., within the processor's cache memory), or any suitable combination thereof, during execution thereof by the machine 600. Accordingly, in various embodiments, the main memory 632, the static memory 634, and the processors 610 are considered machine-readable media 638.

As used herein, the term "memory" refers to a machine-readable medium 638 able to store data temporarily or permanently and may be taken to include, but not be limited to, random-access memory (RAM), read-only memory (ROM), buffer memory, flash memory, and cache memory. While the machine-readable medium 638 is shown, in an example embodiment, to be a single medium, the term "machine-readable medium" should be taken to include a single medium or multiple media (e.g., a centralized or distributed database, or associated caches and servers) able to store the instructions 616. The term "machine-readable medium" shall also be taken to include any medium, or combination of multiple media, that is capable of storing instructions (e.g., the instructions 616) for execution by a machine (e.g., the machine 600), such that the instructions, when executed by one or more processors of the machine (e.g., the processors 610), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 650 include a wide variety of components to receive input, provide output, produce output, transmit information, exchange information, capture measurements, and so on. In general, it will be appreciated that the I/O components 650 can include many other components that are not shown in FIG. 6. The I/O components 650 are grouped according to functionality merely for simplifying the following discussion, and the grouping is in no way limiting. In various example embodiments, the I/O components 650 include output components 652 and input components 654. The output components 652 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 654 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 650 may include communication components 664 operable to couple the machine 600 to a network 680 or devices 670 via a coupling 682 and a coupling 672, respectively. For example, the communication components 664 include a network interface component or another suitable device to interface with the network 680. In further examples, the communication components 664 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 670 may be another machine or any of a wide variety of peripheral devices (e.g., a peripheral device coupled via a USB).

In various example embodiments, one or more portions of the network 680 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 680 or a portion of the network 680 may include a wireless or cellular network, and the coupling 682 may be a Code Division Multiple Access (CDMA) connection, a Global System for Mobile communications (GSM) connection, or another type of cellular or wireless coupling.

Furthermore, the machine-readable medium 638 is non-transitory (in other words, not having any transitory signals) in that it does not embody a propagating signal. However, labeling the machine-readable medium 638 "non-transitory" should not be construed to mean that the machine-readable medium 638 is incapable of movement; the machine-readable medium 638 should be considered as being transportable from one physical location to another. Additionally, since the machine-readable medium 638 is tangible, the machine-readable medium 638 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
    accessing, by one or more hardware processors, design data from a datastore, the design data comprising a netlist for a circuit design;
    generating, by the one or more hardware processors, a model of the circuit design based on the design data, the model comprising a first reluctance matrix $K_d$ that approximates a parasitic effect of a set of mutual inductors in the circuit design, the first reluctance matrix $K_d$ being generated by partitioning a reluctance matrix K into the first reluctance matrix $K_d$ and a second reluctance matrix $K_c$, the reluctance matrix K being included in a first formulation of modified nodal analysis equations of the circuit design, the reluctance matrix K being an inverse of an inductance matrix included in a second formulation of modified nodal analysis equations for the circuit design, the first reluctance matrix $K_d$ comprises all diagonal elements of the reluctance matrix K, and the second reluctance matrix $K_c$ comprises all off-diagonal elements the reluctance matrix K;
    performing, by the one or more hardware processors, a transient simulation of the circuit design based on the model;
    generating, by the one or more hardware processors, output data regarding performance of the circuit design based on the performing of the transient simulation of the circuit design; and
    storing, by the one or more hardware processors, the output data to a datastore.

2. The method of claim 1,
    wherein the generating the model based on the design data comprises:
        determining the first formulation of modified nodal analysis equations for the circuit design that includes the reluctance matrix K; and
        partitioning the reluctance matrix K into the first reluctance matrix $K_d$ and the second reluctance matrix $K_c$,
    wherein the performing the transient simulation of the circuit design based on the model comprises performing the transient simulation based on the first formulation of modified nodal analysis equations by solving the first formulation of modified nodal analysis equations using a Jacobian matrix including the first reluctance matrix $K_d$.

3. The method of claim 2, wherein the determining the first formulation comprises determining the reluctance matrix K based on the inductance matrix, wherein the first formulation includes the reluctance matrix K and excludes the inductance matrix, and wherein the second formulation includes the inductance matrix and excludes the reluctance matrix K.

4. The method of claim 3, wherein the determining the first formulation further comprises generating the second formulation of modified nodal analysis equations based on the design data.

5. The method of claim 1, wherein the partitioning the reluctance matrix K into the first reluctance matrix $K_d$ and the second reluctance matrix $K_c$ is based on a decoupling percentage $\in$, where for each jth row in $K_d$ and $K_c$:

$$\frac{\sum_{i=1}^{N} K_c(j, i)}{\sum_{i=1}^{N} K_d(j, i)} = \in,$$

where i represents a column and N represents a total number columns for $K_d$ and $K_c$.

6. The method of claim 1, wherein the partitioning the reluctance matrix K into the first reluctance matrix $K_d$ and the second reluctance matrix $K_c$ comprises applying an integration method to the reluctance matrix K to extract the second reluctance matrix $K_c$ from the reluctance matrix K and render the first reluctance matrix $K_d$ sparse.

7. The method of claim 1, wherein the partitioning the reluctance matrix K into the first reluctance matrix $K_d$ and the second reluctance matrix $K_c$ is based on a decoupling percentage, the partitioning comprising determining the decoupling percentage by an iterative process that calculates a spectral radius of the first reluctance matrix $K_d$ and the second reluctance matrix $K_c$, and the spectral radius being calculated by:

$$\rho(K_d^{-1} K_c).$$

8. The method of claim 1, further comprising determining a decoupling percentage prior to performing the transient simulation, wherein the partitioning the reluctance matrix K into the first reluctance matrix $K_d$ and the second reluctance matrix $K_c$ is based on the decoupling percentage.

9. A device comprising:
    a memory configured to store design data; and a hardware processor communicatively coupled to the memory and configured to perform operations comprising:

accessing the design data from the memory, the design data comprising a netlist for a circuit design;

generating a model of the circuit design based on the design data, the model comprising a first reluctance matrix $K_d$ that approximates a parasitic effect of a set of mutual inductors in the circuit design, the first reluctance matrix $K_d$ being generated by partitioning a reluctance matrix K into the first reluctance matrix $K_d$ and a second reluctance matrix $K_c$, the reluctance matrix K being included in a first formulation of modified nodal analysis equations of the circuit design, the reluctance matrix K being an inverse of an inductance matrix included in a second formulation of modified nodal analysis equations for the circuit design, the first reluctance matrix $K_d$ comprises all diagonal elements of the reluctance matrix K, and the second reluctance matrix $K_c$ comprises all off-diagonal elements the reluctance matrix K;

performing a transient simulation of the circuit design based on the model;

generating output data regarding performance of the circuit design based on the performing of the transient simulation of the circuit design; and storing the output data to the memory.

10. The device of claim 9, wherein the generating the model based on the design data comprises:

determining the first formulation of modified nodal analysis equations for the circuit design that includes the reluctance matrix K; and partitioning the reluctance matrix K into the first reluctance matrix $K_d$ and the second reluctance matrix $K_c$, wherein the performing the transient simulation of the circuit design based on the model comprises performing the transient simulation based on the first formulation of modified nodal analysis equations by solving the first formulation of modified nodal analysis equations using a Jacobian matrix including the first reluctance matrix $K_d$.

11. A non-transitory computer-readable medium comprising instructions that, when executed by a hardware processor of a device, cause the device to perform operations comprising:

accessing design data from a datastore, the design data comprising a netlist for a circuit design;

generating a model of the circuit design based on the design data, the model comprising a first reluctance matrix $K_d$ that approximates a parasitic effect of a set of mutual inductors in the circuit design, the first reluctance matrix $K_d$ being generated by partitioning a reluctance matrix K into the first reluctance matrix $K_d$ and a second reluctance matrix $K_c$, the reluctance matrix K being included in a first formulation of modified nodal analysis equations of the circuit design, the reluctance matrix K being an inverse of an inductance matrix included in a second formulation of modified nodal analysis equations for the circuit design, the first reluctance matrix $K_d$ comprises all diagonal elements of the reluctance matrix K, and the second reluctance matrix $K_c$ comprises all off-diagonal elements the reluctance matrix K;

performing a transient simulation of the circuit design, based on the model;

generating output data regarding performance of the circuit design based on the performing of the transient simulation of the circuit design; and storing the output data to a datastore.

12. The non-transitory computer-readable medium of claim 11, wherein the first formulation includes the reluctance matrix K and excludes the inductance matrix, and wherein the second formulation includes the inductance matrix and excludes the reluctance matrix K.

13. The non-transitory computer-readable medium of claim 11, wherein the partitioning the reluctance K matrix into the first reluctance matrix $K_d$ and the second reluctance matrix $K_c$ is based on a decoupling percentage $\in$, where for each jth row in $K_d$ and $K_c$:

$$\frac{\sum_{i=1}^{N} K_c(j, i)}{\sum_{i=1}^{N} K_d(j, i)} = \in,$$

where i represents a column and N represents a total number columns for $K_d$ and $K_c$.

14. The non-transitory computer-readable medium of claim 11, wherein the partitioning the reluctance matrix K into the first reluctance matrix $K_d$ and the second reluctance matrix $K_c$ comprises applying an integration method to the reluctance matrix K to extract the second reluctance matrix $K_c$ from the reluctance matrix K and render the first reluctance matrix $K_d$ sparse.

15. The non-transitory computer-readable medium of claim 11, wherein the partitioning the reluctance matrix K into the first reluctance matrix $K_d$ and the second reluctance matrix $K_c$ is based on a decoupling percentage, the partitioning comprising determining the decoupling percentage by an iterative process that calculates a spectral radius of the first reluctance matrix $K_d$ and the second reluctance matrix $K_c$, and the spectral radius is calculated by:

$$\rho(K_d^{-1} K_c).$$

16. The non-transitory computer-readable medium of claim 11, wherein the operations further comprise determining a decoupling percentage prior to performing the transient simulation, wherein the partitioning the reluctance matrix K into the first reluctance matrix $K_d$ and the second reluctance matrix $K_c$ is based on the decoupling percentage.

17. The method of claim 1, wherein the partitioning the reluctance matrix K into the first reluctance matrix $K_d$ and the second reluctance matrix $K_c$ according to:

$$\sum_{i=1}^{N} K_d(j, i) > \sum_{i=1}^{N} K_c(j, i),$$

for each jth row in $K_d$ and $K_c$, where i represents a column and N represents a total number columns for $K_d$ and $K_c$, where i represents a column and N represents a total number columns for $K_d$ and $K_c$.

18. The device of claim 9, wherein the partitioning the reluctance matrix K into the first reluctance matrix $K_d$ and the second reluctance matrix $K_c$ according to:

$$\sum_{i=1}^{N} K_d(j, i) > \sum_{i=1}^{N} K_c(j, i),$$

for each jth row in $K_d$ and $K_c$, where i represents a column and N represents a total number columns for $K_d$ and $K_c$, where i represents a column and N represents a total number columns for $K_d$ and $K_c$.

19. The non-transitory computer-readable medium of claim 11, wherein the partitioning the reluctance matrix K into the first reluctance matrix $K_d$ and the second reluctance matrix $K_c$ according to:

$$\sum_{i=1}^{N} K_d(j, i) > \sum_{i=1}^{N} K_c(j, i),$$

for each jth row in $K_d$ and $K_c$, where i represents a column and N represents a total number columns for $K_d$ and $K_c$, where i represents a column and N represents a total number columns for $K_d$ and $K_c$.

20. The device of claim 9, wherein the partitioning the reluctance K matrix into the first reluctance matrix $K_d$ and the second reluctance matrix $K_c$ is based on a decoupling percentage $\in$, where for each jth row in $K_d$ and $K_c$:

$$\frac{\sum_{i=1}^{N} K_c(j, i)}{\sum_{i=1}^{N} K_d(j, i)} = \in,$$

where i represents a column and N represents a total number columns for $K_d$ and $K_c$.

* * * * *